United States Patent [19]

Bernal G. et al.

[11] 4,031,190

[45] June 21, 1977

[54] HIGH STRENGTH HALIDE ALLOYS

[75] Inventors: Enrique Bernal G., Minnetonka; Barry G. Koepke, Burnsville; Ralph B. Maciolek, Bloomington, all of Minn.

[73] Assignee: Honeywell Inc., Minneapolis, Minn.

[22] Filed: Sept. 29, 1975

[21] Appl. No.: 617,350

[52] U.S. Cl. .............................. 423/466; 423/265; 423/266; 423/275; 423/499
[51] Int. Cl.² ..................... C01B 7/24; C01D 3/04; C01D 3/22
[58] Field of Search .......... 423/466, 499, 267, 265, 423/266, 275

[56] References Cited

OTHER PUBLICATIONS

Journal of Applied Physics, vol. 14, No. 11, pp. 3315–3332, by N. S. Stoloff et al.
Journal of Applied Physics, vol. 45, No. 2, 1974, pp. 969, 970, by B. G. Koepke et al.

Primary Examiner—Edward Stern
Attorney, Agent, or Firm—Omund R. Dahle

[57] ABSTRACT

Fine-grained polygonized halide alloy bodies are formed having comparable optical properties to a single crystal halide body. Heat and force are applied to a single crystal halide to recrystallize or polygonize the halide. Room temperature grain growth observed in fine-grained pure halides is inhibited by alloying.

2 Claims, 4 Drawing Figures

HIGH STRENGTH HALIDE ALLOYS

ORIGIN OF THE INVENTION

The present invention was made under a contract with the Department of Defense.

REFERENCE TO RELATED APPLICATIONS

Reference should be made to co-pending patent applications by R. H. Anderson entitled "Preparation of High Strength Halide Bodies", Ser. No. 634,394, which is a continuation of Ser. No. 445,371 (now abandoned), and by B. G. Koepke entitled "High Strength Halides", Ser. No. 619,264 which is a continuation of Serial No. 445,394 (now abandoned) which are assigned to the same assignee as the present application.

BACKGROUND OF THE INVENTION

This invention is concerned with the formation of fine-grained polygonized halide bodies. In particular, the present invention is concerned with the preparation of high strength halide bodies for use as optical components in infrared systems.

One of the more critical problems encountered in the development of high power lasers is the development of laser windows which are highly transparent to laser radiation at 10.6 microns and at 3 to 5 microns. At the present time, considerable research effort has been devoted to the development of laser windowns from the so-called covalent compounds consisting typically of II-VI compounds such as cadmium telluride, zinc telluride and zinc selenide. The need for improved laser window materials, however, is well known. F. Horrigan et al, "Windows for High Power Laser", Microwaves, Page 68 (January, 1969); M. Sparks, "Optical Distortion by Heated Windows in High Power Laser Systems", J. Appl. Phys., 42, 5029 (1971).

The need for improved laser windows is based on the extremely high laser power throughput required and the fact that the laser windows constitute structural members. In order to maintain high throughput and minimize adverse effects, the amount of energy transferred to the window must be kept low. Laser beam energy can be transferred to the window in two ways: heating of the window caused by either bulk or surface absorption of the beam, or direct conversion of the beam energy to mechanical energy by Brillouin scattering or electrostriction. This energy transfer produces several undesirable effects such as lensing and birefringence, which result in degradation of beam quality and polarization. In extreme cases, severe thermal stresses can be produced in the windows. These stresses, which are further aggravated by the fact that the windows are mounted in a cooling clamp, may lead to fracture of the windows.

The low absorption coefficients of the halides make them outstanding candidates for optical components in infrared systems. The alkali halides exhibit low absorption at 10.6 microns, and the alkaline earth halides exhibit low absorption in the 2 to 6 micron region. Furthermore, because the temperature coefficient of the index of refraction and the thermal expansion have opposite signs, the two effects tend to compensate optical path changes due to temperature, making these materials useful in applications in which heating by a laser beam is anticipated. Halide crystals, however, have low yield strengths and are highly susceptible to plastic deformation. J. J. Gilman, "Plastic Anisotropy of Lif and Other Rock Salt Type Crystals", Acta Met., 7, 608 (1959). These mechanical properties of single crystal alkali halides have precluded their use as high power laser windows.

The outstanding transparency of the halide materials makes it very attractive to attempt to overcome their mechanical deficiencies. Halides can be strengthened without altering their optical properties by hot working of single crystals to produce fully dense polycrystalline material. R. J. Stokes and C. H. Li, Materials Science Research, Vol. 1, pages 133-157, edited by H. H. Stadelmaier and W. W. Austin, Plenum Press, New York, 1963; N. S. Stoloff et al, "Effect of Temperature on the Deformation of KCl-KBr Alloys", J. Appl. Phys., 34, 3315 (1963); and R. J. Stokes, "Mechanical Properties of Polycrystalline Ceramics", Proc. Brit. Ceram. Soc., 189 (1966). This technique involves the deformation and recrystallization of crystals at elevated temperatures to introduce grain boundaries, thereby producing polycrystalline halide materials. The technique described in these articles involved the extrusion of halide materials.

Fine-grained polygonized halide bodies or billets may also be produced by pressing, rolling, or a combination of pressing and rolling. The previously mentioned patent application by R. H. Anderson describes a process for forming fine-grained halide bodies at low temperatures by use of a constraint technique. This technique yields structures which are extremely fine-grained and which can exhibit yield strengths over an order of magnitude higher than the starting single crystal billet. A further advantage of this process is that under certain conditions (temperature, strain rate, initial crystal orientation) the optical properties of the polygonized billet are identical to those of single crystal material.

One problem which has been discovered in fine-grained polygonized halide billets formed by hot working is a rapid and extensive grain growth at room temperature. This behavior occurs in both unconstrained and constrained billets which are hot worked at low temperatures. This room temperature grain growth is undesirable, since polygonized haldies having a small grain size exhibit higher strength than halides having larger grain size.

SUMMARY OF THE INVENTION

Room temperature grain growth in hot worked halide bodies may be inhibited by alloying. In the present invention, the fine-grained polygonized halide body is an alloy of at least a first and a second halide. The amount of the second halide is sufficient to inhibit room temperature grain growth but insufficient to degrade substantially the optical properties of the halide body.

DESCRIPTION OF THE PREFERRED EMBODIMENTS

Microstructural Stability in As-Worked Pure KCl Billets

The fine-grained structure produced in pure alkali halides during hot working can undergo rapid and extensive grain growth at room temperature. Although this behavior is not unique to pure KCl, the present application will discuss this phenomenon in pure KCl which has been hot worked by three techniques. These techniques are constrained and unconstrained press forging and constrained rolling. The constrained hot-working techniques were discussed in detail in the co-pending patent application Ser. No. 445,371 by R. H. Anderson entitled "Preparation of High Strength Halide Bodies". In the constrained hot working techniques, the starting cyclindrical crystal billet is surrounded with a metal ring. During hot working the expanding ring exerts a compressive hoop stress on the deforming crystal and inhibits cracking. With the use of a constraining ring, crystals have been worked to reductions up to 80% in height by press forging and have been cross rolled up to 45% reduction in thickness without cracking. The temperatures in both cases range from about 150° C to about 300° C. Strain rates ranging from 0.001 to 0.1 minutes$^{-1}$ were used in pressing; the strain rate range in rolling was an order of magnitude higher. In most cases, crystals were pressed along <100> directions and rolled on {100} faces in <110> directions.

Figure 1:
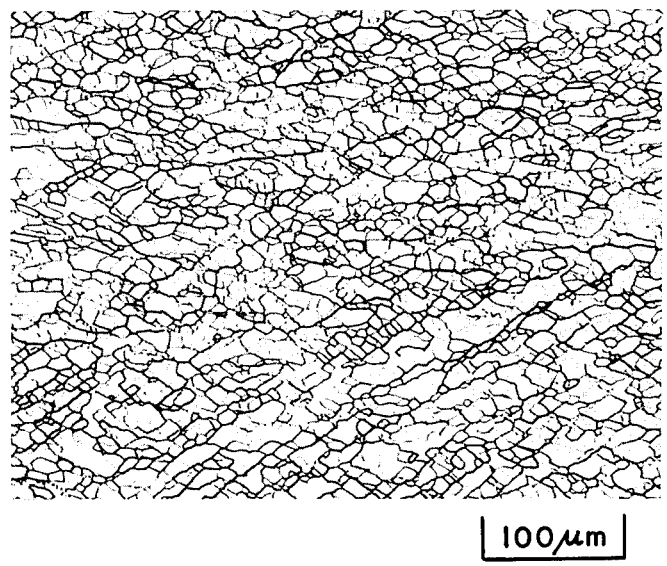
FIG. 1 is a photograph of the fine grain structure of a hot rolled KCl billet.

The fine-grained microstructures produced in KCl crystals by all of these hot working methods are similar. As example showing the structure of a hot rolled KCl crystal is given in FIG. 1. The mean grain size of this particular sample is 3 microns.

Figure 2:
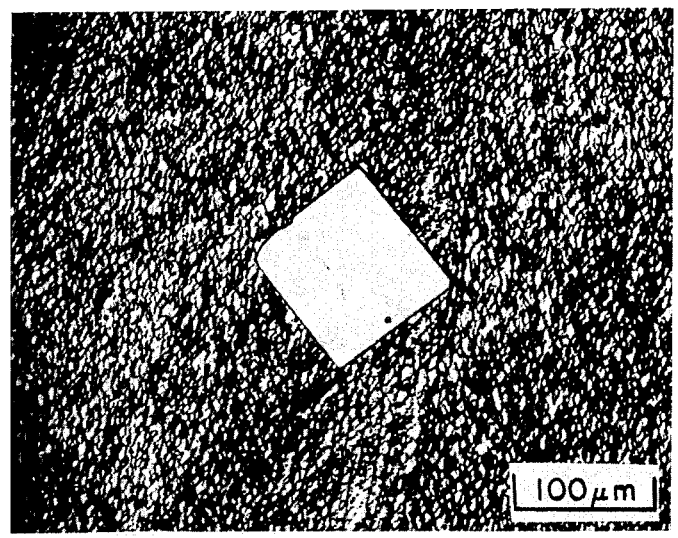
FIG. 2 is a photograph showing a large grain growing at room temperature in a press formed KCl billet.
Figure 3:
FIG. 3 is a photograph showing large grains having boundaries of general curvature in a hot worked KCl billet.

When the hot worked billets were allowed to sit at room temperature, single, isolated grains formed in the billets and grew at an alarming rate. In some cases these large grains consumed most of the fine-grained matrix within a week. An example of a large grain growing at room temperature in a press forged crystal is shown in FIG. 2. The morphology exhibited by the grains shown in FIG. 2 was common and many of the large grains observed had such straight, well defined boundaries. Two surface trace analyses performed on these grains oriented by Laue back reflection photographs indicated that the straight boundaries were primarily defined by {100}. In some instances, the boundaries of the grains had general curvatures shown in FIG. 3. The tendency to form idiomorphic shapes such as shown in FIG. 2 increased with increasing total strain and decreasing working temperature.

Figure 4:
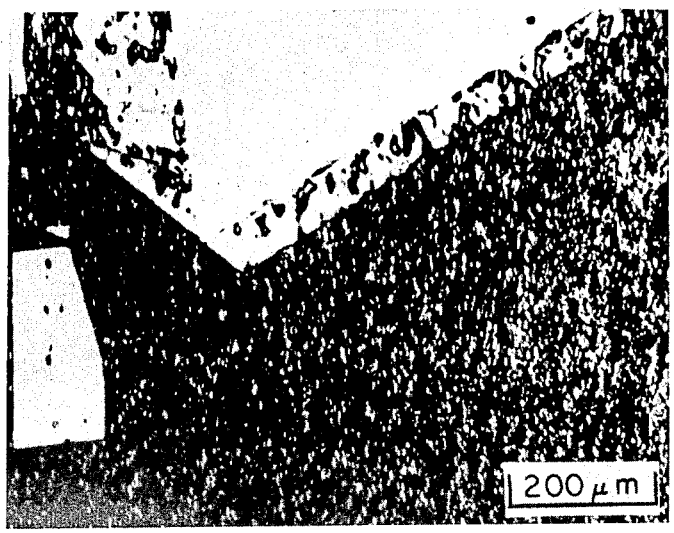
FIG. 4 is a photograph showing a hot worked KCl billet containing large grains that have been repolished and etched after a period of one hour at room temperature. The amount of boundary migration occurring in that time can be seen.

Boundary migration during room temperature grain growth was observed by standard metallographic procedures. FIG. 4 shows a sample containing large grains that was repolished and etched after a period of one hour had elapsed at room temperature. The previously etched surface had only been partially removed, and the initial and final positions of the boundaries are clearly delineated. The right hand boundary had migrated at a rate of 1 micron per minute and the boundary on the left at a rate of 2.4 microns per minute. These rates can only be taken as upper limits since the angle the boundaries made with the surface were not known.

Many observations of a large number of grains undergoing room temperature growth established the following: (1) Straight boundaries tended to remain straight and to migrate in a direction perpendicular to themselves. (2) Most boundary migration rates at room temperature ranged from 0.1 to 1.0 microns per minute and were fairly constant with time, thus indicating a constant driving force. (3) At room temperature the migration rates of straight boundaries in both hot pressed and hot rolled KCl were in the same range. (4) The migration boundaries tended to follow deformation bands in the deformed structures whenever such bands were observed.

Several additional observations were made of as-rolled pur KCl billets. It was routine procedure to cut three bend test bars from each rolled billet. After testing, the microstructure of every bar was photographed. The microstructural stability of these bars was then determined by re-examining the bars for the presence of large grains after a time lapse of a number of weeks. These observations were made on bars cut from ten rolled KCl billets. Six were rolled at 250° C and four were rolled at 200° C. All were cross rolled on a {100} face in <110> directions. This series included billets given two, four, and six passes corresponding to 10% true compressive strain per pass at both temperatures.

The results of observations on these rolled billets indicated that all samples given six passes underwent grain growth. Only one isolated case of grain growth was observed for samples given four passes. No grain growth was noted in samples given two passes. No apparent effect of rolling temperature (i.e. 200° C or 250° C) on the appearance of the large grains was noted.

It should be noted that all bend tests were made within two or three days from the time the billets were rolled. In all samples examined, the large grains were seldom observed upon initial examination of the microstructure of the broken bend test bars. It should also be noted that the bend test bars were cut from the central portions of the disk shaped billets. Large grains have been noted in times shorter than two days on the top and bottom surfaces of the billets at their outer edges, but not in the central regions.

These observations have pointed out two additional factors concerning room temperature grain growth in hot rolled pure KCl. First, a critical strain appeared necessary which, in the case of rolling, was in the vicinity of 40%. Second, the formation of the grains occurred after an incubation period at room temperature that was on the order of 2 or 3 days.

Effects of Alloying on Grain Growth

It has been discovered that room temperature grain growth may be inhibited by the use of halide alloys rather than pure halides. The addition of a very small amount of a second halide to pure KCl has been successful in inhibiting room temperature grain growth. It is believed that alloying pins the grain boundaries, so as to significantly suppress room temperature grain growth.

Three important factors must be considered in determining the preferred halide alloy. First, the amount of the second halide must be sufficient to inhibit room temperature grain growth. Second, the amount of the second alloy which must not be so great as to degrade the optical properties of the halide alloy. Third, the amount of the second halide must not be so great that the alloy body becomes extremely brittle.

Studies have indicated that as little as 0.1% KBr added to pure KCl inhibits the room temperature grain growth which is observed in pure hot worked KCl. In the case of KCl-KBr alloys, therefore, the preferred compositions are 0.1% to about 1% KBr. The absorption of KBr at 10.6 microns is greater than that of KCl. Larger amounts of KBr in the alloy, therefore, will increase the absorption of the alloy. This is an important consideration in limiting the amount of KBr in the alloy.

The addition of KBr to KCl also makes the resulting alloy more brittle. Higher temperatures for hot working, therefore, become necessary. N. S. Stoloff et al, "Effect of Temperature on the Deformation of KCl-KBr Alloys", J. Appl. Phys., 34, 3315 (1963) showed that the strength and brittleness of hot worked KCl-KBr polycrystalline alloys increased with increasing KBr content.

A systematic study of the effects of working temperature, strain rates, and total strain on the structure and properties of KCl-KBr alloy billets was undertaken. Billets of KCl-KBr alloys containing 0.1%, 0.5%, and 1.0% KBr were studied.

The KCl-KBr alloy billets had a nominal diameter of one inch and were 0.5 inches high. As in the case of pure KCl billets, all rolling was carried out with the billets encased in an aluminum constraining ring. The billets were cross rolled on 100 faces in <110> directions for either two or six passes. Reductions of height of the billets corresponds to 10% true strain per pass. The roll surface speeds were 0.35, 3.5, and 9 inches per minute, and roll temperatures of 200° C and 300° C were used.

The optical absorption was measured on every sample before and after rolling. Three-point bend test samples were cut from each rolled billet in a direction parallel to the last rolling direction. The microstructure of each bend test bar was examined on the side of the bar near the fractured surface.

Although the results of the tests are not complete, general comments can be made. First, none of the alloy billets exhibited room temperature grain growth, unlike the behavior of hot rolled pure KCl. The microstructures and textures of the hot rolled KCl-KBr alloys were established identical to those found previously in pure KCl crystals rolled under similar conditions. The structure of the KCl-KBr alloys after hot working was a fine-grained polygonized structure with mean grain sizes of about 3 microns.

Second, a decrease in rolling temperature resulted in a large increase in strength. This was expected from previous experience on pure KCl. The yield strength of 1% KBr alloys increased from 3400 psi to 5100 psi when the rolling temperature was dropped from 300° C to 200° C. In all alloy billets rolled at 200° C, the billets had yield strengths over 4000 psi.

Third, the alloy billets could not be rolled at six passes at 200° C at roll speeds of 3.5 or 9.0 inches per minute without cracking. This indicates that the alloy billets were more brittle than pure KCl billets. Previous experience with pure KCl had shown that hot working of pure KCl billets without cracking could be achieved at 200° C with a roll speed of 9.0 inches per minute for six passes with 10% true strain per pass. This indicates that higher roll temperatures, lower roll surface speeds, or fewer number of passes are necessary for KCl-KBr alloys in comparison to pure KCl.

Fourth, rolling of KCl-KBr alloys on {100} faces in <110> directions did not result in an increase in the optical absorption at 10.6 microns. The hot rolled alloys exhibited essentially the same absorption coefficient both before and after hot rolling. A similar result had previously been observed for hot rolled pure KCl.

Conclusion

The addition of a small amount of a second halide to pure alkali halide will inhibit room temperature grain growth after hot working. The addition of a small amount of KBr to KCl has proved effective in inhibiting room temperature grain growth. Other halides, however, may also be used. For example, solid solution of KCl and rubidium chloride (RbCl) may also be used. In any case, the amount of the second halide of the alloy should be sufficient to inhibit room temperature grain growth but should not be sufficient to degrade substantially the optical properties (especially absorption) of the halide body.

While this invention has been disclosed with particular reference to the preferred embodiments, it will be understood by those skilled in the art that changes in form and detail may be made without departing from the spirit and scope of the invention.

The embodiments of the invention in which an exclusive property or right is claimed are defined as follows:

1. A crack-free optical fine-grained polygonized halide alloy body formed by compressive hot working of a single crystal halide alloy body at temperature between about 150° C and about 300° C to form in the body a polygonized fine-grained structure the body consisting essentially of a solid solution of potassium chloride and at least 0.1% of a second halide of the group consisting of potassium bromide and rubidium chloride, the amount of the second halide in the alloy being sufficient to prevent room temperature grain growth but being much less than the amount of potassium chloride and wherein the amount of the second halide in the alloy is insufficient to increase substantially the optical absorption at 10.6 microns by the halide body and also insufficient to increase substantially the brittleness of the halide body in comparison to a pure fine-grained polygonized body of potassium chloride, and wherein the alloy body has a yield strength of greater than about 3400 psi.

2. A crack-free optical fine-grained polygonized halide alloy body of claim 1 wherein the body has a yield strength of greater than about 4000 psi.

* * * * *

UNITED STATES PATENT OFFICE
CERTIFICATE OF CORRECTION

PATENT NO. : 4,031,190
DATED : June 21, 1977
INVENTOR(S) : Enrique Bernal G., Barry G. Koepke, Ralph B. Maciolek It is certified that error appears in the above-identified patent and that said Letters Patent are hereby corrected as shown below:

Column 1, insert before the first line the sentence --This is a continuation of application Serial No. 445,393, filed February 25, 1974.--, and Cover page, left column, insert --Related U.S. Application Data [63] Continuation of Ser. No. 445,393, Feb. 25, 1974, abandoned.--.

Signed and Sealed this

Fifteenth Day of May 1979

[SEAL]

Attest:

RUTH C. MASON
Attesting Officer

DONALD W. BANNER
Commissioner of Patents and Trademarks